United States Patent [19]

Suzuki et al.

[11] Patent Number: 5,286,597
[45] Date of Patent: Feb. 15, 1994

[54] PHOTOSENSITIVE TRANSFER MATERIAL

[75] Inventors: Tamotsu Suzuki; Mikio Totsuka, both of Shizuoka; Tohru Nakatsuka; Masanori Ohiwa, both of Osaka, all of Japan

[73] Assignees: Fuji Photo Film Co., Ltd., Minami-ashigara; Nippon Paint Co., Ltd., Osaka, both of Japan

[21] Appl. No.: 853,041

[22] Filed: Mar. 18, 1992

[30] Foreign Application Priority Data

Mar. 19, 1991 [JP] Japan ................................ 3-80765

[51] Int. Cl.$^5$ ................................ G03C 1/805
[52] U.S. Cl. ................................ 430/262; 430/257; 430/259; 430/293; 430/950
[58] Field of Search ............... 430/253, 252, 199, 256, 430/257, 259, 950, 293, 262

[56] References Cited

U.S. PATENT DOCUMENTS

| | | | |
|---|---|---|---|
| 4,599,299 | 7/1986 | Neiss et al. | 430/273 |
| 4,614,708 | 9/1986 | Timmerman et al. | 430/517 |
| 4,746,595 | 5/1988 | Sanders | 430/271 |
| 4,885,225 | 12/1989 | Heller et al. | 430/160 |
| 5,002,850 | 3/1991 | Shinazaki et al. | 430/166 |
| 5,004,668 | 4/1991 | Namiki et al. | 430/250 |
| 5,059,509 | 10/1991 | Mino et al. | 430/257 |
| 5,126,226 | 6/1992 | Fröhlich et al. | 430/257 |

*Primary Examiner*—Charles L. Bowers, Jr.
*Assistant Examiner*—John A. McPherson
*Attorney, Agent, or Firm*—Sughrue, Mion, Zinn, Macpeak & Seas

[57] ABSTRACT

The photosensitive transfer material of the invention comprises a support, a subbing layer comprising an organic polymer and an image-forming layer containing a photosensitive polymer, wherein the subbing layer and/or the image-forming layer contains a matting agent of core-shell type crosslinked resin particles consisting of a core part made of a polymer having a crosslinking degree of 0.05 to 3.0 mmole/g and a shell part made of a substantially linear polymer having at least one kind of a hydrophilic functional group.

9 Claims, No Drawings

PHOTOSENSITIVE TRANSFER MATERIAL

FIELD OF THE INVENTION

The present invention relates to a photosensitive transfer material comprising a support, a subbing layer and an image-forming layer, superposed in this order. More particularly, the invention relates to a photosensitive transfer material suitably employable as a color proof.

BACKGROUND OF THE INVENTION

As described in Japanese Patent Publications No. 46(1971)-15326 and No. 49(1974)-441, there is known a method comprising imagewise exposing a photosensitive transfer material consisting essentially of a support, a peel layer made of an organic polymer and an image-forming layer (color material-containing photosensitive layer or a composite layer of a color material layer and a photosensitive layer), superposed in this order, then developing the photosensitive transfer material to form a color image on the peel layer, and transferring the color image onto an optional support (permanent support) using an adhesive. This method has such a merit that various operations such as an overlay type operation and a surprint type operation can be utilized as a color proofing operation for the method. However, this method also has a demerit that the process of the method is complicated because an adhesive is necessarily used in each transferring stage and it is difficult to keep the accuracy in the adjustment of each image position during the transferring stage.

For improving the complicated process, a method of transferring the obtained image onto the permanent support under application of heat and pressure is disclosed in Japanese Patent Provisional Publications No. 47(1972)-41830, No. 48(1973)-9373 and No. 51(1976)-5101. Particularly, Japanese Patent Provisional Publication No. 51(1976)-5101 describes that a heat-fusible polymer layer is provided as an adhesive layer on the permanent support, and Japanese Patent Provisional Publication No. 47(1972)-41830 describes that an image is directly transferred onto the permanent support made of an art paper or a coat paper using the above-mentioned method.

However, these methods also have various defects. That is, the final image transferred onto the permanent support is reversed in right and left to the original. Further, in the case of using the heat-fusible polymer as an adhesive, a high temperature for the transference is required because a melting point of the polymer generally is high, and the dimensional stability of the support is reduced by influence of heat, whereby the positions of the transferred images become discrepant from each other. On the contrary, in the case of using a heat-fusible polymer having a low melting point as an adhesive, unfavorable adhesion is brought about after image formation, or the surface of the final image is easily damaged.

As a method of improving the above defects, Japanese Patent Provisional Publication No. 59(1984)-97140 describes a method of temporarily transferring a color image onto a temporary image-receiving sheet (referred to simply as "image-receiving sheet" hereinafter) prior to the transference of the color image onto a permanent support. In this method, an image-receiving sheet having an image-receiving layer made of a photopolymerizable material such as an ethylenic polyfunctional monomer (this image-receiving layer is also referred to as "a photopolymerizable image-receiving layer" or "a photopolymerizable adhesive layer") on a support is prepared. Onto the image-receiving sheet, color images are temporarily transferred one after another to form a laminate of the color images on the photopolymerizable image-receiving layer, before each color image is transferred onto the permanent support. Thereafter, the laminate of the color images is transferred onto the permanent support with the photopolymerizable image-receiving layer, and then the transferred photopolymerizable image-receiving layer is wholly exposed to light on the permanent support to cure the transferred photopolymerizable image-receiving layer.

This image-transferring method using the image-receiving sheet solves the above-mentioned problems and further has an advantage that an erect image of the mask original can be obtained on the permanent support. Moreover, since the photopolymerizable image-receiving layer of the image-receiving sheet contains an ethylenic polyfunctional monomer, the photopolymerizable image-receiving layer itself is soft and transference of images at a low temperature is possible. In addition, after the transference of images, the photopolymerizable image-receiving layer can be easily cured by the exposure to light on the whole surface. Accordingly, any adhesion is not brought about after the images are transferred, and the final image is resistant to damage, so that this image-transferring method is an advantageous image-forming method in practical use.

However, the image-receiving sheet used in the method described in Japanese Patent Provisional Publication No. 59(1984)-97140 still has a problem that the adhesion strength between the photopolymerizable image-receiving layer (i.e., photopolymerizable adhesive layer) and the support is disadvantageously high when the image-receiving layer is in the unexposed state (i.e., unpolymerized state). That is, in the case that the photopolymerizable adhesive layer with the laminate of each color images is transferred onto the final support (permanent support), and then the support of the image-receiving sheet is peeled off prior to the exposure operation, peel lines (streaks) easily occur on the surface of the transferred photopolymerizable adhesive layer. For this reason, the method described in Japanese Patent Provisional Publication No. 59(1984)-97140 adopts a process comprising the steps of transferring the photopolymerizable adhesive layer having images thereon onto the final support, then subjecting the layer to exposure to light on the whole surface to cure the photopolymerizable adhesive layer so as to lower the adhesion strength between the photopolymerizable adhesive layer and the support of the image-receiving sheet, and then removing the support of the image-receiving sheet.

In the method of forming an image by way of transference of an image (i.e., image transferring method), a photosensitive laminate comprising a support, a subbing layer (e.g., a peel layer) made of an organic polymer and a photosensitive image-forming layer superposed in this order is employed as a photosensitive transfer material, as described before. The photosensitive transfer material may be further provided with a barrier layer between the peel layer and the image-forming layer to prevent occurrence of color material fogging on the non-image portion obtained after developing procedure.

In the process for preparing a color proof used for color proofing utilizing a photosensitive transfer material, photosensitive transfer materials for each colors (four colors) are prepared in the first place; then, they are exposed to light and developed to form an image of individual color on the image-forming layer of each photosensitive transfer material; thereafter, the obtained image-formed layers of each colors are transferred with the peel layer onto the image-receiving sheet one after another under application of heat and pressure with adjusting (joining) positions of those color images. Therefore, on the surface of the image-receiving sheet after the transference of the first color image, a peel layer of the first transferred color image is present. When the position of the second color image is tried to be joined with the position of the first color image to transfer the second color image onto the first color image, adjustment (joining) of the image positions is hardly made because the slipperiness between film surfaces of the images to be joined is insufficient owing to tackiness and adhesiveness of the peel layer, resulting in deterioration of workability. Further, there has been found other defect that air is drawn into between film surfaces of the images when ununiform force is applied during the transferring stage, whereby air bubbles are included in the transferred image. The inclusion of air bubbles in the obtained image (the latter defect) causes no problem in practical use, but it is unfavorable from the viewpoint of commercial value.

The above-mentioned problems such as reduction in slipperiness between film surfaces and inclusion of air bubbles are markedly shown between the peel layer previously laminated on the image-receiving sheet and the image layer superposed thereon, for example, between the surface of the non-image portion (peel layer) of the first color image and the surface of the image portion of the second color image. However, the same problems are also shown in a photosensitive transfer material having a barrier layer between the peel layer and the image-forming layer, as far as the barrier layer basically has such characteristics as tackiness and heat-adhesiveness.

For solving the above-mentioned problems, it has been proposed that matting agent particles such as silica particles are introduced into the peel layer, but in the case of using the known matting agent particles, the particles are unstable in a coating solution (i.e., coating solution for the formation of a peel layer), or the adhesive strength in the transferring stage is reduced, and as a result, uniform adhesion is hardly made.

SUMMARY OF THE INVENTION

It is an object of the present invention is to provide a photosensitive transfer material which is improved in adjustment of positions of each color images in the case that each color images are formed and then transferred onto the image-receiving sheet with adjusting the positions of those images in a multicolor image-forming method using a photosensitive transfer material, and which is excellent in workability.

It is another object of the invention to provide a photosensitive transfer material which can effectively prevent occurrence of air bubbles in the transferred image caused by introduction of air into between the film surfaces of the transferred images.

There is provided by the present invention a photosensitive transfer material comprising a support, a subbing layer comprising an organic polymer and an image-forming layer, in which the subbing layer and/or the image-forming layer contains a matting agent of core-shell type crosslinked resin particles consisting of a core part made of a polymer having a crosslinking degree of 0.05 to 3.0 mmole/g and a shell part made of a substantially straight-chain polymer having at least one kind of a hydrophilic functional group.

DETAILED DESCRIPTION OF THE INVENTION

The photosensitive transfer material of the present invention is now described in detail.

In the photosensitive transfer material of the invention, a subbing layer of an organic polymer and an image-forming layer are provided on a support.

Support materials employable in the photosensitive transfer material of the invention can be selected from any known materials. Examples of the support materials include films (sheets) of plastic materials such as polyethylene terephthalate, polypropylene, polyethylene, polyvinyl chloride, polystyrene, polycarbonate and cellulose triacetate. Particularly, a biaxially oriented polyethylene terephthalate film is preferred from the viewpoints of strength, heat resistance, dimensional stability and transparency. There is no specific limitation on the thickness of the support, but generally the thickness thereof is in the range of 50 to 150 $\mu$m.

The subbing layer provided on the support is composed of a known organic polymer which generally exhibits non-tackiness at room temperature but exhibits tackiness and adhesiveness under application of heat. The subbing layer functions as a peel layer. In some cases, a barrier layer is provided on the peel layer as described before, and in the case of providing the barrier layer, the peel layer and the barrier layer together constitute the subbing layer.

Examples of materials for the subbing layer employable in the invention include polyacrylic ester, acrylic ester copolymer, polymethacrylic ester, methacrylic ester copolymer, polyacrylamide, polyacrylamide copolymer, polyvinyl acetate, vinyl acetate copolymer, polyvinyl chloride, vinyl chloride copolymer, polyvinylidene chloride, vinylidene chloride copolymer, polystyrene, styrene copolymer, ethylene copolymer (e.g., ethylene/vinyl acetate copolymer, ethylene/vinyl chloride copolymer, ethylene/acrylic acid copolymer), polyvinyl acetal (e.g., polyvinyl butyral, polyvinyl formal), polyester resin, polyamide resin (e.g., nylon, copolymer nylon), various rubbers (e.g., synthetic rubber, rubber chloride), and polyolefin (e.g., polyethylene, polypropylene).

These materials can be employed singly or in combination. As the material of the peel layer, a material containing alcohol-soluble polyamide as a host component is particularly preferred.

The peel layer may contain various additives such as a tackiness-imparting material and a plastifiable material, if desired.

The thickness of the peel layer preferably is in the range of 0.2 to 10 $\mu$m.

In the case of using a solvent which swells or partially dissolves a peel layer-forming material as a solvent of a coating solution for the formation of an image-forming layer provided on the peel layer, there sometimes occur troubles such that color material fogging is brought about on the non-image portion (i.e., portion corresponding to the peel layer) after development. In some cases, therefore, a barrier layer composed of a material which is insoluble in the above-mentioned solvent is provided on the peel layer to prevent the troubles. For example, in the case of forming the peel layer from a resin material mainly containing alcohol-soluble polyamide and using alcohol such as methanol, ethanol or propanol as a solvent of a coating solution for the formation of an image-forming layer, the above-mentioned color material fogging easily occurs. Accordingly, it is preferred to provide a barrier layer composed of an alcohol-insoluble material between the peel layer and the image-forming layer. A material of the barrier layer can be appropriately selected from the above-exemplified various organic polymers as materials of the peel layer, cellulose type resins, etc., in consideration of various solvents used for the preparation of a photosensitive transfer material.

When the subbing layer has the aforementioned two-layer structure, the thickness of the peel layer is in the range of 0.2 to 10 μm, preferably 0.2 to 8 μm, and the thickness of the barrier layer is in the range of 0.2 to 10 μm, preferably 0.2 to 8 μm.

Next, the matting agent particles contained in the subbing layer and/or the image-forming layer are described in detail.

The matting agent particles used in the invention are crosslinked resin particles of core-shell type. Each particle consists essentially of a core part which is composed of a polymer having a crosslinking degree of 0.05 to 3.0 mmole/g, preferably 0.1 to 2.5 mmole/g, and a shell part which is composed of a substantially linear polymer having at least one kind of hydrophilic functional group. The linear polymer of the shell part may be chemically bonded to the polymer of the core part. Otherwise, the shell part may be formed through a semi-iPN structure wherein a part of the linear polymer of the shell part invades inside the core part and other part thereof exists outside the core part. The linear polymer of the shell part may partially take a branched or crosslinked structure if desired, as far as the polymer has a substantially linear structure as a whole.

When the crosslinking degree of the polymer is less than 0.05 mmole/g, workability in a stage of adjusting positions of images or other stages markedly deteriorates. When the crosslinking degree thereof is more than 3.0 mmole/g, stability of the coating solution for forming a layer is extremely reduced.

The core-shell type crosslinked resin particles can be prepared by various conventionally known processes. For example, core-shell type crosslinked resin particles in which the polymer of the shell part is chemically bonded to the core part can be prepared by processes described in Japanese Patent Provisional Publications No. 62(1987)-246916 and No. 62(1987)-84113. Otherwise, core-shell type crosslinked resin particles formed through a semi-iPN structure wherein a part of the straight-chain polymer of the shell part invades inside the core part and other part thereof exists outside the core part can be advantageously prepared by processes described in Japanese Patent Provisional Publications No. 61(1986)-223015 and No. 2(1987)-119271. However, there is no specific limitation on the process for preparing the core-shell type crosslinked resin particles employable as matting agent particles in the invention.

The hydrophilic functional group of the shell part of the core-shell type crosslinked resin particles used as matting agent particles in the invention is preferably selected from carboxyl group, hydroxyl group, amide group, sulfonic acid group, and groups in the form of sulfonic acid amine salt or alkali metal salt of sulfonic acid (e.g., sodium salt, potassium salt), in consideration of stability of a coating solution containing the matting agent particles and performance of preventing color material fogging. These hydrophilic functional groups can be easily introduced into the shell part by the use of monomers having the hydrophilic functional groups in the preparation of the shell part.

A particle diameter (mean particle diameter) of the core-shell type crosslinked resin particles used as matting agent particles in the invention varies depending on a thickness of the layer containing these particles, but generally, the mean particle diameter thereof is in the range of 0.005 to 10 μm, preferably in the range of 0.01 to 3 μm. When the mean particle diameter thereof is smaller than 0.005 μm, the objects of the invention such as enhancement of workability in adjustment of image position in the transferring stage can be hardly accomplished. When the mean diameter thereof exceeds 10 μm, stability of the coating solution tends to lower or color material fogging may occur.

In the core-shell type crosslinked resin particles used as the matting agent particles in the invention, a ratio between the core part and the shell part is preferably in the range of 99:1 (core part:shell part) to 10:90, more preferably 99:1 to 15:85, by weight. When the weight of the shell part is too small, dispersion stability of the coating solution or adhesion under application of heat tends to lower. Otherwise, the weight of the shell part is too large, workability in a stage of adjusting positions of images or other stages tends to deteriorate.

In the invention, the above-mentioned matting agent may be employed singly or in combination of two or more kinds. Further, the matting agent can be also employed in combination with other known matting agents.

It is preferred that the matting agent particles are contained in the peel layer in an amount of 0.002 to 50% by weight, preferably 1 to 20% by weight, based on the amount of the organic polymer (functioning as a binder) contained in the peel layer. If the amount of the matting agent particles is less than 1% by weight, workability in the adjustment of positions of color images during the transferring procedure deteriorates, and air bubbles tend to occur in the transferred image. If the amount of the matting agent particles exceeds 20% by weight, heat-adhesion of the peel layer becomes insufficient, resulting in lowering of transferring properties.

When the subbing layer has the aforementioned two-layer structure (peel layer and barrier layer), the matting agent particles may be contained in both of the peel layer and the barrier layer, or may be contained in only the barrier layer. However, it is preferred that the matting agent particles are contained in at least the barrier layer. The amount of the matting agent particles used herein is preferably in the range of 0.002 to 50% by weight, more preferably 1 to 20% by weight, based on the amount of the organic polymer (binder) contained in the barrier layer.

The image-forming layer provided on the subbing layer is described hereinafter.

The photosensitive transfer material of the invention is particularly advantageously employed for preparing a color proof. Accordingly, the image-forming layer of the photosensitive transfer material is required to be colored to form a color image of yellow, magenta, cyan or black. The image-forming layer may be constructed as a photosensitive resin layer containing a color material, or may be constructed as a laminate consisting essentially of a color material layer and a photosensitive resin layer. With respect to the structure and material of the image-forming layer, a variety of types have been already known.

A combination of a color material layer and a photosensitive resin layer is described below.

The color material layer basically is a layer containing a color material such as a pigment or a dye dispersed or dissolved in an organic polymer (binder).

The color material employable in the invention can be appropriately selected from conventionally known color materials. As the color materials, there can be mentioned a variety of pigments and dyes described in Japanese Patent Provisional Publications No. 47(1972)-16124 and No. 52(1977)-89916, U.S. Pat. No. 4,472,494, Japanese Patent Provisional Publications No. 55(1980)-117142 and No. 55(1980)-127552, and Color Index. In the case of using the photosensitive transfer material of the invention as a color proof for printing, pigments are preferably employed as the color material to enhance the color reproducibility in the printed matter.

A binder holding the color material is generally selected from any known binders, and can be used singly or in the form of a mixture. From the viewpoints of cost of a developer, working atmosphere and easiness in waste water disposal, an alkali-soluble binder is preferably employed.

Examples of the alkali-soluble binders include polymers containing salt-forming group as described in U.S. Pat. No. 2,893,368; cellulose polymers containing acid group as described in U.S. Pat. No. 2,927,022; copolymers such as methyl methacrylate/methacrylic acid copolymer as described in West German Patent (OLS) No. 2,123,702; acid-containing polymers such as styrene/mono-n-butyl maleate copolymer and vinyl acetate/crotonic acid copolymer as described in OLS No. 2,205,146; vinyl addition polymers containing free carboxylic acid group such as one or more kinds of alkyl acrylate copolymerized with acrylic acid as described in OLS No. 2,320,849; and copolymers such as methacrylic acid/aralkyl methacrylate copolymer described in Japanese Patent Publication No. 59(1984)-44615. Also employable are organic polymers (binders), phenol resins, rosin, polyhydroxy styrene, etc. as described in Japanese Patent Provisional Publications No. 47(1972)-16124 and No. 52(1977)-899916, U.S. Pat. No. 4,472,494, and Japanese Patent Provisional Publications No. 55(1980)-117142 and No. 55(1980)-127552.

If desired, the color material layer may contain other additives such as a plasticizer, a pigment dispersion stabilizer and a surface active agent.

The amount of the color material contained in the color material layer varies depending on the purpose, but generally the amount thereof is in the range of 5 to 50% by weight.

The photosensitive resin layer is a layer made of a film-forming photosensitive material, and the layer shows such characteristics that the solubility in a solvent is different between the exposed portion and the unexposed portion after exposure operation. Utilizing such characteristics, any one portion (exposed portion or unexposed portion) can be selectively removed by the developing process. As the materials showing such characteristics, various materials are known. Representative examples of such materials include photopolymerizable compounds, photo-decomposable compounds and photo-crosslinkable compounds.

Examples of the photopolymerizable compounds include polyfunctional vinyl monomers capable of forming photopolymers through addition polymerization and monomer compounds such as vinylidene compounds, and they are favorably employed in the invention.

As the vinyl monomers or the vinylidene compounds, preferred are unsaturated esters of polyol, particularly esters of acrylic acids or methacrylic acids. Concrete examples of the esters include ethylene glycol diacrylate, glycerol triacrylate, polyacrylate, ethylene glycol dimethacrylate, 1,3-propanediol dimethacrylate, polyethylene glycol dimethacrylate, 1,2,4-butanetriol trimethacrylate, trimethylolethane triacrylate, pentaerythrite dimethacrylate, pentaerythrite trimethacrylate, pentaerythrite tetramethacrylate, pentaerythrite diacrylate, pentaerythrite triacrylate, pentaerythrite tetraacrylate, dipentaerythrite polyacrylate, 1,3-propanediol diacrylate, 1,5-pentanediol dimethacrylate, bis(metha)acrylate of polyethylene glycol having molecular weight of 200-400, and compounds similar thereto.

As the monomer compound, unsaturated amides can be also employed. Examples of the unsaturated amides include unsaturated amides of acrylic acids and methacrylic acids having $\alpha$, $\omega$-diamine and ethylene bismethacrylamides. The alkylene chain of the unsaturated amide can be opened at carbon atom.

The photopolymerizable monomers used in the invention are by no means restricted to the above-mentioned compounds.

The photosensitive resin layer containing the above photopolymerizable compound further contains an organic polymer binder and a photopolymerization initiator activated by active rays, and if desired, a heat-polymerization inhibitor may be added to the layer.

Examples of the photopolymerization initiators include aromatic ketones such as benzophenone, Michler's ketone [4,4'-bis(dimethylamino)benzophenone], 4,4'-bis(dimethylamino)benzophenone, 4-methoxy-4'-dimethylaminobenzophenone, 2-ethylanthraquinone, phenanthraquinone and other aromatic ketones; benzoin ethers such as benzoin, benzoin methyl ether, benzoin ethyl ether and benzoin phenyl ether; benzoins such as methyl benzoin and ethyl benzoin; and imidazole dimers such as 2-(o-chrolophenyl)-4,5-diphenylimidazole dimer, 2-(o-chrolophenyl)-4,5-(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, and 2,4,5-triacrylimidazole dimer as described in U.S. Pat. No. 3,479,185, U.K. Patent No. 1,047,569 and U.S. Pat. No. 3,784,557.

As the organic polymer binder, vinyl polymers are preferred from the viewpoint of compatibility with the above-mentioned monomer compounds and photopolymerization initiators. Examples of the vinyl polymers include polyvinyl chloride, polyacrylic acid, polymethyl acrylate, polyethyl acrylate, polybutyl acrylate, polymethacrylic acid, polymethyl methacrylate, polyvinyl ether, polyvinyl acetal and copolymers thereof, but the vinyl polymers employable in the invention are by no means restricted to those polymers and copolymers.

A ratio between the monomer compound and the organic polymer binder varies depending on a combination of the used monomer compound and the used organic polymer binder, but in general, the ratio therebetween preferably is in the range of 1:10 to 2:1, by weight. The amount of the photopolymerization initiator used herein is preferably in the range of 0.01 to 20% by weight based on the amount of the monomer compound.

Examples of the heat-polymerization inhibitors include p-methoxyphenyl, hydroquinone, alkyl-substituted or aryl-substituted hydroquinone, t-butyl catechol, pyrogallol, naphthylamine, β-naphthol, phenothiazine, pyridine, nitrobenzene, o-toluquinone and aryl phosphite, but the heat-polymerization inhibitors employable in the invention are by no means restricted thereto.

As the photo-decomposable compounds, there can be mentioned for example quinone diazide type photosensitive materials.

As the photo-crosslinkable compounds, there can be representatively mentioned polyvinyl cinnamate derived from polyvinyl alcohol. Further, there can be also mentioned mixtures of compounds having an azide group as a photosensitive group and binders such as polyacrylamide, polyacrylonitrile, alcohol-soluble nylon, rubbers and styrene/butadiene copolymers.

From the viewpoints of cost of developer, workability and easiness in waste water disposal, the above-mentioned photopolymerizable compounds and photodecomposable compounds are preferably employed as the photosensitive material of the photosensitive resin layer.

The matting agent particles used in the invention may be contained in either the color material layer or the photosensitive resin layer. Otherwise, they can be contained in both of those layers.

The amount of the matting agent particles is in the range of 0.002 to 50% by weight, preferably 1 to 20% by weight, in any case, that is, a case of adding the particles to the color material layer only, a case of adding the particles the photosensitive resin layer only or a case of adding the particles to both of those layers.

The image-forming layer having the above structure can be formed by mixing and dissolving any of the above-mentioned photosensitive materials and the organic polymer binder (and other optional additives, if desired) in the above-described appropriate solvent to prepare a coating solution (photosensitive solution) for the formation of a photosensitive resin layer, then coating the solution on the color material layer having been prepared in the similar manner, and drying the coated layer.

The thickness of the color material layer varies depending on the aimed color image-forming material and the used photosensitive material, but the thickness thereof is generally in the range of 0.05 to 10 μm, preferably 0.1 to 5 μm.

The thickness of the photosensitive resin layer also varies depending on the aimed color image-forming material and the used photosensitive material, but the thickness thereof is generally in the range of 0.1 to 20 μm, preferably 0.4 to 5 μm.

As described hereinbefore, the photosensitive resin layer and the color material layer can be united to form the image-receiving layer (color material-containing photosensitive resin layer) using a photosensitive resin as a binder of the color material layer.

The color material-containing photosensitive resin layer can be formed by mixing and dissolving any of the above-mentioned photosensitive materials, the color material and the organic polymer binder (and other optional additives, if desired) in the above-described appropriate solvent to prepare a coating solution (photosensitive solution), then coating the solution onto the aforementioned subbing layer, and drying the coated layer.

The thickness of the color material-containing photosensitive resin layer varies depending on the aimed color image-forming material and the used photosensitive material, but the thickness thereof is generally in the range of 0.1 to 20 μm, preferably 0.4 to 5 μm.

Details of materials of the photosensitive resin layer and methods for the formation thereof are described in, for example, Japanese Patent Publications No. 46(1971)-15326 and No. 46(1971)-35682, Japanese Patent Provisional Publications No. 44(1969)-72494, No. 47(1972)-41830, No. 48(1973)-93337 and No. 49(1974)-441, Japanese Patent Publication No. 55(1980)-6210, Japanese Patent Provisional Publications No. 51(1976)-5101, No. 49(1984)-97140 and No. 60(1985)-46694, and U.S. Pat. No. 3,887,450.

The photosensitive transfer material of the invention may further have a protective layer to enhance resistance to damage or to prevent reduction of sensitivity caused by air. The protective layer can be formed by coating a solution of a high-molecular material such as polyvinyl alcohol, polyvinyl acetate, methyl vinyl ether/maleic anhydride copolymer, polyvinyl pyrrolidone, gelatin and gum arabic on the image-forming layer and drying the coated layer.

Examples of the processes for preparing crosslinked resin particles of core-shell type employable in the invention as matting agent particles (preparation examples) are given below. In these examples, the term "part(s)" means "part(s) by weight", unless specifically mentioned.

PREPARATION EXAMPLE 1

A matting agent (1) (core:shell=5:5 (by weight), crosslinking degree of core part: 1.8 mmole/g, hydrophilic functional group=amide group, bonding between shell part and core part=chemical bonding) was prepared by the following process.

1) Preparation of polyfunctional monomer for chemically bonding shell part to core part Into a glass reactor equipped with a thermometer, a reflux condenser, a nitrogen gas-introducing tube and a stirrer were charged 172 parts of monobutyl maleate, 149 parts of glycidyl methacrylate and 0.5 part of p-methoxyphenol, and they were reacted in the reactor at 160° C. for 1 hour. Then, the reaction product was cooled to obtain a polyfunctional monomer having maleic acid type double bond and methacrylic acid type double bond.

2) Preparation of matting agent (1)

Into a glass reactor equipped with a thermometer, a reflux condenser, a nitrogen gas-introducing tube and a stirrer were charged 300 parts of deionized water, 5 parts of methyl methacrylate and 1 part of ammonium persulfate, and they were reacted in the reactor at 75° C. for 20 minutes under introduction of nitrogen gas.

Then, in the resulting reaction mixture was dropped a monomer mixture consisting of 20 parts of methyl methacrylate, 20 parts of ethylene glycol dimethacrylate and 10 parts of the polyfunctional monomer obtained in the above stage 1) over a period of 60 minutes. Thereafter, the resulting mixture was matured for 30 minutes to prepare a dispersion containing resin fine particles (forming core part).

Subsequently, in the obtained dispersion was dropped a monomer mixture for the formation of shell part consisting of 20 parts of methyl methacrylate, 15 parts of styrene, 10 parts of n-butyl acrylate and 5 parts of methacrylamide over a period of 60 minutes. The resulting mixture was matured for 60 minutes and then cooled to obtain a micro-emulsion containing particles having a mean diameter of 0.38 $\mu$m.

The obtained micro-emulsion was freeze-dried in a vacuum freeze-dryer to obtain a matting agent (1).

PREPARATION EXAMPLE 2

A matting agent (2) (core:shell=8:2 (by weight), crosslinking degree of core part: 0.58 mmole/g, hydrophilic functional group=carboxyl group, bonding between shell part and core part=semi-iPN) was prepared by the following process.

Into a glass reactor equipped with a thermometer, a reflux condenser, a nitrogen gas-introducing tube and a stirrer were charged 400 parts of deionized water, 5 parts of methyl methacrylate and 1 part of ammonium persulfate, and they were reacted in the reactor at 80° C. for 20 minutes under introduction of nitrogen gas. Then, in the resulting reaction mixture was dropped a monomer mixture consisting of 30 parts of methyl methacrylate, 40 parts of styrene and 10 parts of divinylbenzene (55% concentration) over a period of 120 minutes. Thereafter, the resulting mixture was matured for 30 minutes to prepare a dispersion containing resin fine particles (forming core part).

Subsequently, in the obtained dispersion was dropped a monomer mixture for the formation of shell part consisting of 10 parts of methyl methacrylate, 5 parts of styrene and 5 parts of methacrylic acid over a period of 30 minutes. The resulting mixture was matured for 60 minutes and then cooled to obtain a micro-emulsion containing particles having a mean diameter of 0.45 $\mu$m.

The obtained micro-emulsion was freeze-dried in a vacuum freeze-dryer to obtain a matting agent (2).

PREPARATION EXAMPLE 3

A matting agent (3) (core:shell=7:3 (by weight), crosslinking degree of core part: 1.4 mmole/g, hydrophilic functional group=hydroxyl group, bonding between shell part and core part=chemical bonding) was prepared by the following process.

1) Preparation of polyester-type emulsifying agent having amphoteric ion group

Into a glass reactor equipped with a thermometer, a reflux condenser, a nitrogen gas-introducing tube, a stirrer and a decanter were charged 134 parts of bishydroxyethyl taurine, 130 parts of neopentyl glycol, 236 parts of azelaic acid, 186 parts of phthalic anhydride and 27 parts of xylene, and the temperature of the resulting reaction liquid in the reactor was raised. Water produced by the reaction was removed through azetropy with xylene. The temperature of the reaction liquid was raised to 190° C. over a period of about 2 hours since the reflux was initiated, and stirring of the reaction liquid and dehydration were continued until the acid value corresponding to carboxylic acid became 145. The reaction liquid was then cooled to 140° C. Subsequently, in the reaction liquid was dropped 314 parts of glycidyl versatate (trade name: Cardura E10, available from Shell Inc.) over a period of 30 minutes, and then stirring of the liquid was continued for 2 hours to complete the reaction. The obtained polyester resin had acid value of 59, hydroxyl value of 90 and Mn of 1,054.

2) Preparation of matting agent (3)

Into a glass reactor equipped with a thermometer, a reflux condenser, a nitrogen gas-introducing tube and a stirrer were charged 215 parts of deionized water, 10 parts of the polyester-type emulsifying agent obtained in the above stage 1) and 1 part of diethanolamine, and the temperature of the reaction liquid in the reactor was raised to 80° C. under introduction of nitrogen gas. Then, in the reaction liquid were separately dropped a monomer mixture consisting of 25 parts of methyl methacrylate, 15 parts of n-butyl acrylate, 20 parts of ethylene glycol dimethacrylate and 10 parts of the polyfunctional monomer obtained in the stage 1) of Preparation Example 1 and an initiator aqueous solution (used herein 70 wt. % of the whole weight) consisting of 20 parts of deionized water, 1 part of azobiscyanovaleric acid and 0.64 part of dimethyl ethanolamine from different apertures of the reactor over a period of 40 minutes. Thereafter, the resulting mixture was matured for 20 minutes to prepare a dispersion containing resin fine particles (forming core part).

Subsequently, to the obtained dispersion were separately dropped a monomer mixture for the formation of shell part consisting of 10 parts of methyl methacrylate, 15 parts of styrene and 5 parts of 2-hydroxyethyl methacrylate and a residue of the above initiator aqueous solution from different apertures of the reactor over a period of 20 minutes. The resulting reaction mixture was matured for 60 minutes and then cooled to obtain a micro-emulsion containing particles having a mean diameter of 0.16 $\mu$m.

The obtained micro-emulsion was freeze-dried in a vacuum freeze-dryer to obtain a matting agent (3).

PREPARATION EXAMPLE 4

A matting agent (4) (core:shell=2:8 (by weight), crosslinking degree of core part: 1.3 mmole/g, hydrophilic functional group=hydroxyl group and amide group, bonding between shell part and core part=chemical bonding) was prepared by the following process.

Into a glass reactor equipped with a thermometer, a reflux condenser, a nitrogen gas-introducing tube and a stirrer were charged 215 parts of deionized water, 10 parts of the polyester-type emulsifying agent obtained in the stage 1) of Preparation Example 3 and 1 part of diethanolamine, and the temperature of the mixture in the reactor was raised to 80° C. under introduction of nitrogen gas. Then, in the reaction liquid were separately dropped a monomer mixture consisting of 5 parts of methyl methacrylate, 5 parts of n-butyl acrylate, 5 parts of ethylene glycol dimethacrylate and 5 parts of the polyfunctional monomer obtained in the stage 1) of Preparation Example 1 and an initiator aqueous solution (used herein in an amount of 20 wt. % of the whole amount) consisting of 20 parts of deionized water, 1 part of azobiscyanovaleric acid and 0.64 part of dimethyl ethanolamine from different apertures of the reactor over a period of 20 minutes. Thereafter, the resulting mixture was matured for 20 minutes to prepare a dispersion containing resin fine particles (forming core part).

Subsequently, to the obtained dispersion were separately dropped a monomer mixture for the formation of shell part consisting of 30 parts of methyl methacrylate, 25 parts of styrene, 17 parts of n-butyl acrylate, 3 parts of 2-hydroxyethyl methacrylate and 5 parts of diacetone acrylamide and a residue of the above initiator aqueous solution from different apertures of the reactor over a period of 40 minutes. The resulting reaction mixture was matured for 60 minutes and then cooled to obtain a micro-emulsion containing particles having a mean diameter of 0.09 μm.

The obtained micro-emulsion was freeze-dried in a vacuum freeze-dryer to obtain a matting agent (4).

PREPARATION EXAMPLE 5

A matting agent (5) (core:shell=9:1 (by weight), crosslinking degree of core part: 0.9 mmole/g, hydrophilic functional group=sodium sulfonate, bonding between shell part and core part=semi-iPN) was prepared by the following process.

Into a glass reactor equipped with a thermometer, a reflux condenser, a nitrogen gas-introducing tube and a stirrer were charged 623 parts of deionized water, 12.5 parts of methyl methacrylate and 1 part of ammonium persulfate, and they were reacted in the reactor at 80° C. for 20 minutes under introduction of nitrogen gas. Then, in the resulting reaction mixture was dropped a monomer mixture consisting of 30 parts of methyl methacrylate, 20 parts of styrene, 20 parts of n-butyl acrylate and 20 parts of divinylbenzene (55% concentration) over a period of 100 minutes. Thereafter, the resulting mixture was matured for 60 minutes to prepare a dispersion containing resin fine particles (forming core part).

Subsequently, in the obtained dispersion was dropped a monomer mixture for the formation of shell part consisting of 5 parts of methyl methacrylate, 5 parts of styrene and 3 parts of styrene sulfonic acid soda over a period of 20 minutes. The resulting mixture was matured for 60 minutes and then cooled to obtain a micro emulsion containing particles having a mean diameter of 0.80 μm.

The obtained micro-emulsion was freeze-dried in a vacuum freeze-dryer to obtain a matting agent (5).

The present invention is further illustrated by the following examples and comparison examples, but those examples are given by no means to restrict the invention.

EXAMPLE 1

A coating solution of the following composition for forming a peel layer was prepared.

| Coating solution for forming peel layer | |
|---|---|
| Alcohol-soluble polyamide (trade name: CM-8000, viscosity [η]: 23 cps (20° C., 10 wt. % methanol solution), available from Toray Industries, Inc.) | 7.2 g |
| Polyhydroxystyrene (trade name: Resin M, mean molecular weight: 5,500, available from Maruzen Petroleum Co., Ltd.) | 1.8 g |
| Matting agent particles (1) prepared in Preparation Example 1 | 0.03 g |

The coating solution was evenly coated over a polyethylene terephthalate film (support) having a thickness of 100 μm, and the coated layer was dried to form a peel layer having a dry thickness of 0.5 μm on the support.

Then, a mother liquor A of the following composition for dispersing a color material (pigment) was prepared in order to form a color material layer.

| Mother liquor A | |
|---|---|
| Styrene/maleic acid copolymer resin (trade name: Oxylac SH-101, available from Nippon Shokubai Co., Ltd.) | 20 g |
| Methyl ethyl ketone | 80 g |

Using the above-prepared mother liquor A, color material (pigment) dispersions of four colors having the following compositions were prepared.

| Yellow pigment dispersion | |
|---|---|
| Mother liquor A | 110 g |
| Methyl ethyl ketone | 40 g |
| Methyl cellosolve acetate | 25 g |
| Seika fast yellow (trade name: H-0755, available from Dainippon Seika Co., Ltd.) | 24.4 g |
| Magenta pigment dispersion | |
| Mother liquor A | 110 g |
| Methyl ethyl ketone | 40 g |
| Methyl cellosolve acetate | 25 g |
| Seika fast carmine (trade name: 1483, available from Dainippon Seika Co., Ltd.) | 12.2 g |
| Cyan pigment dispersion | |
| Mother liquor A | 110 g |
| Methyl ethyl ketone | 40 g |
| Methyl cellosolve acetate | 25 g |
| Cyanine blue (trade name: 4920, available from Dainippon Seika Co., Ltd.) | 12.2 g |
| Black pigment dispersion | |
| Mother liquor A | 110 g |
| Methyl ethyl ketone | 40 g |
| Methyl cellosolve acetate | 25 g |
| Mitsubishi carbon black (trade name: MA-100, available from Mitsubishi Kasei Corporation) | 12.2 g |

Each of the above dispersions was prepared by stirring the components for 3 hours in a testing disperser (paint shaker, produced by Toyo Seiki Co., Ltd.).

For diluting the above dispersions, a diluting liquid having the following composition was prepared.

| Diluting liquid | |
|---|---|
| Methyl ethyl ketone | 550 g |
| Methyl cellosolve acetate | 130 g |
| Fluorine type surface active agent (trade name: Fluorad FC-430, available from Sumitomo 3M Co., Ltd) | 2 g |

Each of the dispersions of four colors obtained in the above was diluted using the above diluting liquid in the following weight ratio between the dispersion and the diluting liquid. Then, each of the obtained diluted dispersions was subjected to stirring for 10 minutes and ultrasonic dispersing for 10 minutes, to prepare coating dispersions of four colors for the formation of color material layers.

Each of thus obtained coating dispersions of four colors was filtered over a filter (Toyo filter paper No. 63). Then, each of thus filtrated coating dispersions was applied onto the peel layer provided on each of four supports using a whirler, and each coated layer was dried at 100° C. for 2 minutes to form four sheets each having a color material layer.

| Yellow layer | |
|---|---|
| Pigment dispersion:Diluting liquid | 3.5:46.5 |
| Thickness | 1.0 μm |
| Optical density (blue filter) | 0.5 |
| Magenta layer | |
| Pigment dispersion:Diluting liquid | 4:46 |
| Thickness | 0.7 μm |
| Optical density (green filter) | 0.75 |
| Cyan layer | |
| Pigment dispersion:Diluting liquid | 4:46 |
| Thickness | 0.8 μm |
| Optical density (red filter) | 0.65 |
| Black layer | |
| Pigment dispersion:Diluting liquid | 5.5:44.5 |
| Thickness | 0.7 μm |
| Optical density (no filter) | 0.90 |

A positive type photosensitive solution having the following composition was filtrated over the above-mentioned filter of No. 63. Then, thus filtrated photosensitive solution was applied onto each of the above-obtained color material layers of four colors using a whirler, and each coated layer was dried at 100° C. for 2 minutes to form a photosensitive resin layer (image-forming layer) having a thickness of 1 μm.

| Positive type photosensitive solution | |
|---|---|
| Cumyl phenol 1,2-naphthoquinone-(2)-diazide-5-sulfonate | 1.36 g |
| Novolak type phenol formaldehyde resin (trade name: PR-50716, available from Sumitomo Dules Co., Ltd.) | 2.86 g |
| Abietic acid | 0.32 g |
| Fluorine type surface active agent (trade name: Megafac F-104, available from Dainippon Ink & Chemicals Inc.) | 0.05 g |
| n-Propyl acetate | 84 g |
| Cyclohexanone | 42 g |

Thus, photosensitive transfer materials (A) of four kinds (four colors) according to the invention, each consisting of a support, a peel layer containing matting agent particles (1), a color material layer and a photosensitive resin layer, superposed in order, were prepared.

COMPARISON EXAMPLE 1

The procedures of Example 1 were repeated except for using a coating solution not containing the matting agent particles (1) for the formation of a peel layer, to prepare photosensitive transfer materials (a) of four kinds (four colors) for comparison, each consisting of a support, a peel layer, a color material layer and a photosensitive resin layer, superposed in order.

EXAMPLE 2

A coating solution for the formation of a peel layer having the same composition as that of the coating solution for the formation of a peel layer used in Example 1 but not containing the matting agent particles (1) was prepared. The coating solution was applied onto a polyethylene terephthalate film (support) having a thickness of 100 μm in the same manner as that of Example 1, to form a peel layer having a thickness of 0.5 μm on the support.

Then, a coating solution of the following composition for forming a barrier layer was prepared.

| Coating solution for forming barrier layer | |
|---|---|
| Polymethyl methacrylate (mean molecular weight: 100,000) | 3 g |
| Methyl ethyl ketone | 80 g |
| Methyl Cellosolve acetate | 20 g |
| Matting agent particles (1) prepared in Preparation Example 1 | 0.05 g |

The coating solution was evenly coated on the peel layer, and the coated layer was dried to form a barrier layer having a dry thickness of 0.5 μm on the peel layer.

Subsequently, a mother liquor B and a mother liquor C of the following compositions for dispersing a color material (pigment) were prepared in order to form a color material layer.

| Mother liquor B | |
|---|---|
| Styrene/maleic acid copolymer resin (trade name: Oxylac SH-101, available from Nippon Shokubai Co., Ltd.) | 20 g |
| n-Propanol | 80 g |
| Mother liquor C | |
| Methoxymethylated nylon (trade name: Trezine MF-30, available from Teikoku Kagaku Kogyo Co., Ltd.) | 10 g |
| Methanol | |

Using the above-prepared mother liquor B and mother liquor C, color material (pigment) dispersions of four colors having the following compositions were prepared.

| Yellow pigment dispersion | |
|---|---|
| Mother liquor B | 95 g |
| Mother liquor C | 30 g |
| n-Propanol | 28 g |
| Acetone | 20 g |
| Seika fast yellow (trade name: H-0755, available from Dainippon Seika Co., Ltd.) | 24.4 g |
| Magenta pigment dispersion | |
| Mother liquor B | 95 g |
| Mother liquor C | 30 g |
| n-Propanol | 28 g |
| Acetone | 20 g |
| Seika fast carmine (trade name: 1483, available from Dainippon Seika Co., Ltd.) | 12.2 g |
| Cyan pigment dispersion | |
| Mother liquor B | 95 g |
| Mother liquor C | 30 g |
| n-Propanol | 28 g |
| Acetone | 20 g |
| Cyanine blue (trade name: 4920, available from Dainippon Seika Co., Ltd.) | 12.2 g |
| Black pigment dispersion | |
| Mother liquor B | 95 g |
| Mother liquor C | 30 g |
| n-Propanol | 28 g |
| Acetone | 20 g |
| Mitsubishi carbon black (trade name: MA-100, available from Mitsubishi Kasei Corporation) | 12.2 g |

Each of the above dispersions was prepared by stirring the components for 6 hours in a testing disperser (paint shaker, produced by Toyo Seiki Co., Ltd.).

For diluting the above dispersions, a diluting liquid having the following composition was prepared.

| Diluting liquid | |
|---|---|
| Methyl ethyl ketone | 40 g |
| Acetone | 28 g |

-continued

| Diluting liquid | |
|---|---|
| Fluorine type surface active agent (trade name: Fluorad FC-430, available from Sumitomo Three-M Co., Ltd) | 0.2 g |

Each of the dispersions of four colors was diluted using the above diluting liquid in the following weight ratio between the dispersion and the diluting liquid. Then, each of the obtained diluted dispersions was subjected to stirring for 10 minutes and ultrasonic dispersing for 10 minutes to prepare coating dispersions of four colors for the formation of color material layers.

Each of the coating dispersions of four colors was filtrated over a filter (Toyo filter paper No. 63). Then, each of thus filtrated coating dispersions was applied onto the barrier layer side of each of four supports using a whirler, and each coated layer was dried at 100° C. for 2 minutes to form four sheets each having a color material layer.

| Yellow layer | |
|---|---|
| Pigment dispersion:Diluting liquid | 3.5:46.5 |
| Thickness | 1.0 μm |
| Optical density (blue filter) | 0.5 |
| Magenta layer | |
| Pigment dispersion:Diluting liquid | 4:46 |
| Thickness | 0.7 μm |
| Optical density (green filter) | 0.75 |
| Cyan layer | |
| Pigment dispersion:Diluting liquid | 4:46 |
| Thickness | 0.8 μm |
| Optical density (red filter) | 0.65 |
| Black layer | |
| Pigment dispersion:Diluting liquid | 5.5:44.5 |
| Thickness | 0.7 μm |
| Optical density (no filter) | 0.90 |

On each of the color material layers of four colors was formed the same photosensitive resin layer (image-forming layer) as that of Example 1 under the same conditions as those of Example 1, to prepare photosensitive transfer materials (B) of four kinds (four colors) according to the invention, each consisting of a support, a peel layer, a barrier layer containing the matting agent particles (1), a color material layer and a photosensitive resin layer, superposed in order.

COMPARISON EXAMPLE 2

The procedures of Example 2 were repeated except for using a coating solution not containing matting agent particles for the formation of a barrier layer, to prepare photosensitive transfer materials (b) of four kinds (four colors) for comparison, each consisting of a support, a peel layer, a barrier layer, a color material layer and a photosensitive resin layer, superposed in order.

EXAMPLE 3

A coating solution of the following composition for forming a peel layer was prepared.

| Coating solution for forming peel layer | |
|---|---|
| Alcohol-soluble polyamide (trade name: CM-8000, viscosity [η]: 23 cps (20° C., 10 wt. % methanol solution), available from Toray Industries, Inc.) | 7.2 g |
| Polyhydroxy styrene (trade name: Resin M, mean molecular weight: 5,500, available from Maruzen Petroleum Co., Ltd.) | 1.8 g |
| Matting agent particles (2) prepared in Preparation Example 2 | 0.45 g |

The coating solution was evenly coated over a polyethylene terephthalate film (support) having a thickness of 100 μm, and the coated layer was dried to provide a peel layer having a dry thickness of 0.5 μm on the support.

Then, as a coating solution for the formation of a photosensitive resin layer, photosensitive solutions having the following compositions, each containing each of four color materials of yellow, magenta, cyan and black, were prepared in order to form an image of N→P type.

| Photosensitive solution for forming yellow layer | |
|---|---|
| Benzyl methacrylate/methacrylic acid copolymer (molar ratio: 73/23, viscosity [η]: 0.12 (intrinsic viscosity in methyl ethyl ketone at 25° C.)) | 60 g |
| Pentaerythritol tetraacrylate | 43.2 g |
| Michler's ketone | 2.4 g |
| 2-(o-Chlorophenyl)-4,5-diphenyl imidazole dimer | 2.5 g |
| Seika fast yellow (trade name: H-0755, available from Dainippon Seika Co., Ltd.) | 9.4 g |
| Methyl cellosolve acetate | 560 g |
| Methyl ethyl ketone | 280 g |

Photosensitive solution for forming magenta layer

The procedure for preparing the photosensitive solution for forming an yellow layer described above was repeated except for using 5.2 g of Seika fast carmine (trade name: 1483, available from Dainippon Seika Co., Ltd.) instead of Seika fast yellow, to prepare a photosensitive solution for forming a magenta layer.

Photosensitive solution for forming cyan layer

The procedure for preparing the photosensitive solution for forming an yellow layer described above was repeated except for using 5.6 g of cyanine blue (trade name: 4920, available from Dainippon Seika Co., Ltd.) instead of Seika fast yellow, to prepare a photosensitive solution for forming a cyan layer.

Photosensitive solution for forming black layer

The procedure for preparing the photosensitive solution for forming an yellow layer described above was repeated except for using 6.6 g of Mitsubishi carbon black (trade name: MA-100, available from Mitsubishi Kasei Corporation) instead of Seika fast yellow, to prepare a photosensitive solution for forming a black layer.

Each of the photosensitive solutions of four colors was coated on the peel layer provided on each of four supports, and each of the coated layer was dried to form a photosensitive resin layer having a dry thickness of 2.4 μm.

Independently, a coating solution of the following composition for forming a protective layer was prepared, and the coating solution was coated on each of the above-obtained photosensitive resin layers to form a protective layer having a dry thickness of 1.5 μm.

| Coating solution for forming protective layer | |
|---|---|
| Polyvinyl alcohol (trade name: GL-05, available from Nippon Gosei Kagaku Kogyo Co., Ltd.) | 60 g |
| Water | 97 g |
| Methanol | 30 g |

Thus, photosensitive transfer materials (C) of four colors (negative type colored photosensitive material sheets) according to the invention, each consisting of a support, a peel layer containing matting agent particles (2), a photosensitive resin layer containing a color material and a protective layer, superposed in order, were prepared.

COMPARISON EXAMPLE 3

The procedures of Example 3 were repeated except for using a coating solution not containing the matting agent particles (2) for the formation of a peel layer, to prepare photosensitive transfer materials (c) of four kinds (four colors) for comparison, each consisting of a support, a peel layer, a photosensitive resin layer containing a color material and a protective layer, superposed in order.

EXAMPLE 4

The procedure for preparing a coating solution for the formation of a peel layer in Example 3 was repeated except for not using the matting agent particles (2) to prepare a coating solution for forming a peel layer. The coating solution was evenly coated on a polyethylene terephthalate film (support) having a thickness of 100 μm, and the coated layer was dried to form a peel layer having a dry thickness of 0.5 μm on the support.

Then, the procedure for preparing a coating solution for the formation of a photosensitive resin layer in Example 3 was repeated except for using the matting agent particles (2) in an amount of 10 g per each photosensitive solutions of yellow, magenta, cyan and black, to prepare coating solutions for forming photosensitive resin layers.

Using the coating solutions obtained in the above, photosensitive transfer materials of four colors (D) (negative type colored photosensitive material sheets) according to the invention, each consisting of a support, a peel layer, a photosensitive resin layer containing both of matting agent particles (2) and a color material, and a protective layer, superposed in order, were prepared in the same manner as that of Example 3.

COMPARISON EXAMPLE 4

The procedures of Example 4 were repeated except for using silica particles (mean particle diameter: 2 μm) as a matting agent instead of the matting agent particles (2), to prepare photosensitive transfer materials (d) of four kinds (four colors) for comparison, each consisting of a support, a peel layer, a photosensitive resin layer containing both of silica particles and a color material, and a protective layer, superposed in order.

EXAMPLE 5

A coating solution of the following composition for forming a peel layer was prepared.

| Coating solution for forming peel layer | |
|---|---|
| Alcohol-soluble polyamide (trade name: CM-8000, viscosity [η]: 23 cps (20° C., 10 wt. % methanol solution), available from Toray Industries, Inc.) | 7.2 g |
| Polyhydroxystyrene (trade name: Resin M, mean molecular weight: 5,500, available from Maruzen Petroleum Co., Ltd.) | 1.8 g |
| Methanol | 400 g |
| Methyl cellosolve | 100 g |

The coating solution was evenly coated over a polyethylene terephthalate film (support) having a thickness of 100 μm, and the coated layer was dried to form a peel layer having a dry thickness of 0.5 μm on the support.

Then, a mother liquor A of the following composition for dispersing a color material (pigment) was prepared in order to form a color material layer.

| Mother liquor A | |
|---|---|
| Styrene/maleic acid copolymer resin (trade name: Oxylac SH-101, available from Nippon Shokubai Co., Ltd.) | 20 g |
| Methyl ethyl ketone | 80 g |

Using the above mother liquor A, color material (pigment) dispersions of four colors having the following compositions were prepared.

| Yellow pigment dispersion | |
|---|---|
| Mother liquor A | 110 g |
| Methyl ethyl ketone | 40 g |
| Methyl cellosolve acetate | 25 g |
| Seika fast yellow (trade name: H-0755, available from Dainippon Seika Co., Ltd.) | 24.4 g |
| Magenta pigment dispersion | |
| Mother liquor A | 110 g |
| Methyl ethyl ketone | 40 g |
| Methyl cellosolve acetate | 25 g |
| Seika fast carmine (trade name: 1483, available from Dainippon Seika Co., Ltd.) | 12.2 g |
| Cyan pigment dispersion | |
| Mother liquor A | 110 g |
| Methyl ethyl ketone | 40 g |
| Methyl cellosolve acetate | 25 g |
| Cyanine blue (trade name: 4920, available from Dainippon Seika Co., Ltd.) | 12.2 g |
| Black pigment dispersion | |
| Mother liquor A | 110 g |
| Methyl ethyl ketone | 40 g |
| Methyl cellosolve acetate | 25 g |
| Mitsubishi carbon black (trade name: MA-100, available from Mitsubishi Kasei Corporation) | 12.2 g |

Each of the above dispersions was prepared by stirring the components for 3 hours in a testing disperser (paint shaker, produced by Toyo Seiki Co., Ltd.).

For diluting the above dispersions, a diluting liquid having the following composition was prepared.

| Diluting liquid | |
|---|---|
| Methyl ethyl ketone | 550 g |
| Methyl cellosolve acetate | 130 g |
| Fluorine type surface active agent (trade name: Fluorad FC-430, available from Sumitomo 3M Co., Ltd) | 2 g |

Each of the dispersions of four colors obtained in the above was diluted using the above diluting liquid in the following weight ratio between the dispersion and the diluting liquid. Then, each of the obtained diluted dispersions was subjected to stirring for 10 minutes and ultrasonic dispersing for 10 minutes to prepare coating dispersions of four colors for forming color material layers.

Each of thus obtained coating dispersions of four colors was filtrated over a filter (Toyo filter paper No. 63). Then, each of thus filtrated coating dispersions was applied onto the peel layer provided on each of four supports using a whirler, and each coated layer was dried at 100° C. for 2 minutes to form four sheets each having a color material layer.

| Yellow layer | |
|---|---|
| Pigment dispersion:Diluting liquid | 3.5:46.5 |
| Thickness | 1.0 μm |
| Optical density (blue filter) | 0.5 |
| Magenta layer | |
| Pigment dispersion:Diluting liquid | 4:46 |
| Thickness | 0.7 μm |
| Optical density (green filter) | 0.75 |
| Cyan layer | |
| Pigment dispersion:Diluting liquid | 4:46 |
| Thickness | 0.8 μm |
| Optical density (red filter) | 0.65 |
| Black layer | |
| Pigment dispersion:Diluting liquid | 5.5:44.5 |
| Thickness | 0.7 μm |
| Optical density (no filter) | 0.90 |

A positive type photosensitive solution having the following composition was filtrated over the aforementioned filter of No. 63. Then, thus filtrated photosensitive solution was applied onto each of the above-obtained color material layers of four colors in an amount of 0.8 g/m² (in terms of solid content) using a whirler, and each coated layer was dried at 100° C. for 2 minutes to form a photosensitive resin layer (image-forming layer) having a thickness of 0.8 μm.

| Positive type photosensitive solution | |
|---|---|
| p-t-Octylphenol 1,2-naphthoquinone-(2)-diazide-4-sulfonate | 1.36 g |
| Novolak type phenol formaldehyde resin (trade name: PR-50716, available from Sumitomo Dules Co., Ltd.) | 2.86 g |
| Abietic acid | 0.32 g |
| Fluorine type surface active agent (trade name: Megafac F-104, available from Dainippon Ink & Chemicals Inc.) | 0.05 g |
| n-Propyl acetate | 28 g |
| Toluene | 67 g |
| Matting agent particles (1) prepared in Preparation Example (1) | 0.4 g |

Thus, photosensitive transfer materials (E) of four kinds (four colors) according to the invention, each consisting of a support, a peel layer, a color material layer and a photosensitive resin layer containing matting agent particles (1), superposed in order, were prepared.

COMPARISON EXAMPLE 5

The procedures of Example 5 were repeated except for using a photosensitive solution not containing the matting agent particles (1), to prepare photosensitive transfer materials (e) of four kinds (four colors) for comparison, each consisting of a support, a peel layer, a color material layer and a photosensitive resin layer, superposed in order.

Evaluation of photosensitive transfer material

Each of the photosensitive transfer materials [(A) to (E) and (a) to (e)] of four colors obtained as above was imagewise exposed to a light of a ultra high-pressure mercury lamp of 1 kw (P-607Fw, produced by Dainippon Screen Co., Ltd.) for 60 seconds using a color separation mask corresponding to each color. Then, each of the photosensitive transfer materials was subjected to automatic development at 31° C. for 34 seconds using a five-times diluted liquid of a color art developer (trade name: CA-1, available from Fuji Photo Film Co., Ltd.) in an automatic developing machine (color art processer CA-600P, produced by Fuji Photo Film Co., Ltd.). Thus, color proofing sheets of four colors which accurately reproduced colors corresponding to the color separation masks were obtained.

Independently, a coating solution of the following composition for forming a first layer and a coating solution of the following composition for forming a second layer were coated in order on a biaxially oriented polyethylene terephthalate film having a thickness of 100 μm in such a manner that the first layer and the second layer would have dry thickness of 1.0 μm and 20 μm, respectively, and the coated layers were dried to prepare a image-receiving sheet.

| Coating solution for forming first layer | |
|---|---|
| Polyvinyl chloride (trade name: Zeon 25, available from Nippon Zeon Co., Ltd.) | 10.0 g |
| Methyl ethyl ketone | 240 g |
| Cyclohexanone | 60 g |
| Coating solution for forming second layer | |
| Methyl methacrylate polymer (mean molecular weight: 100,000, available from Wako Junyaku Kogyo Co., Ltd.) | 90.0 g |
| Pentaerythritol tetraacrylate | 90.0 g |
| Michler's ketone | 0.51 g |
| Benzophenone | 3.18 g |
| Paramethoxyphenol | 0.09 g |
| Methyl ethyl ketone | 220 g |

Subsequently, the color proofing sheet of black was superposed on the image-receiving sheet in such a manner that the color image side of the color proofing sheet was in contact with the film surface of the image-receiving sheet, then they were heated under a pressure using a color art transferring machine (trade Name: CA-600T, available from Fuji Photo Film Co., Ltd.), and the support of the color proofing sheet was peeled off to transfer a black image on the image-receiving sheet. Thereafter, the remaining color proofing sheets of three colors were subjected to transference of three color images one after another onto the previously-transferred black color image with adjusting the positions of the images, to obtain an image-receiving sheet having dotted images of four colors thereon.

The image-receiving sheet having four color images thereon was superposed on an art paper (final support), and they were heated under a pressure using the above-mentioned transferring machine. Then, the support of the image-receiving sheet was peeled off to obtain a color image on the art paper.

Finally, the color image obtained on the art paper was subjected to exposure on the whole surface (post exposure) for 120 seconds using a daylight screen of ultra high-pressure mercury lamp (P-607FW, produced by Dainippon Screen Co., Ltd.) to eliminate absorption of the photosensitive material in the visible region and to enhance color reproduction thereof. Thus, a final image was obtained on the art paper.

The final image obtained after the above process was evaluated on occurrence of air bubbles. Further, the images of four colors obtained on the way of the process were also evaluated on easiness of adjusting positions of the images.

The evaluation of the final image was conducted by observing occurrence of air bubbles existing on a predetermined area (22×32 cm$^2$) of the final image through visual observation and counting the number of air bubbles.

The evaluation on easiness of adjusting positions of images was conducted by measuring a static coefficient of friction (the coefficient indicates contact condition) between the non-image surface [subbing layer (peel layer)] and the 10% dotted image surface using a static friction meter (trade name: HEIDON-10 type, produced by Shinto Kagaku Co., Ltd.) and comparing the obtained values (static coefficients of friction) with each other.

The evaluation on easiness of adjusting positions of the images was classified into the following three classes.

AA: The static coefficient of friction is not more than 0.6.

BB: The static coefficient of friction is in the range of 0.61 to 0.9.

CC: The static coefficient of friction is not less than 0.91.

The results are set forth in Table 1

TABLE 1

| Photosensitive Transfer Material | Matting Agent Particle | Number of Air Bubbles in Final Image | Easiness of Adjusting Image Position (static coefficient of friction) |
| --- | --- | --- | --- |
| (A) | (1) | 0 | AA (0.50) |
| (a) | — | 12 | CC (1.00) |
| (B) | (1) | 0 | AA (0.55) |
| (b) | — | 20 | CC (1.40) |
| (C) | (2) | 0 | AA (0.48) |
| (c) | — | 8 | CC (1.00) |
| (D) | (2) | 0 | AA (0.60) |
| (d) | silica | 0 | AA (0.60) |
| (E) | (1) | 0 | AA (0.50) |
| (e) | — | 5 | BB (0.90) |

As is evident from the results set forth in Table 1, the final image obtained using the photosensitive transfer materials of the invention [(A) to (E)] was free from occurrence of air bubbles, and in the process using the photosensitive transfer materials of the invention, the adjustment of positions of the images can be easily made, so that transference of the images was favorably made. However, the final image obtained using the photosensitive transfer materials for comparison [(a) to (c), (e)] except the photosensitive transfer material (d) included air bubbles, and in the process using the photosensitive transfer materials for comparison [(a) to (c), (e)], the adjustment of positions of the images was not easy as compared with that in the process using the photosensitive transfer materials of the invention.

In the case of transference of images using the photosensitive transfer material (d) containing silica, occurence of lifting (peeling caused by insufficient adhesion) was found.

Evaluation of matting agent particle on dispersing stability in coating solution for forming layer A coating solution having the following composition was prepared.

| Coating solution | |
| --- | --- |
| Alcohol-soluble polyamide (trade name: CM-8000, viscosity [η]: 23 cps (20° C., 10 wt. % methanol solution), available from Toray Industries, Inc.) | 7.2 g |
| Polyhydroxystyrene (trade name: Resin M, mean molecular weight: 5,500, available from Maruzen Petroleum Co. Ltd.) | 1.8 g |
| Methanol | 400 g |
| Propylene glycol monomethyl ether | 100 g |

In the coating solution was dispersed each of the four kinds of matting agent particles (mean particle diameter: 5 μm) [the aforementioned matting agent particles (1), (2), (3) and silica particles] in an amount of 0.03 g, to prepare four kinds of dispersions. Each of the dispersions was allowed to stand at room temperature (23° C.) for 2 days, and precipitation of the mating agent particles in each dispersion was observed through visual observation and evaluated.

As a result, the matting agent particles (1) to (3) used in the photosensitive transfer materials of the invention exhibited excellent dispersing stability in the coating solution. On the other hand, the silica particles exhibited low dispersing stability in the coating solution, and a part of the silica particles was precipitated.

EFFECT OF THE INVENTION

In the case of forming a multi-color image by transferring color images onto an image-receiving sheet one after another using the photosensitive transfer material of the invention containing the aforementioned specific matting agent particles, slipperiness between the color image and the image-receiving sheet or between the subbing layer and the film surface of the color image is excellent, and thereby adjustment (joining) of positions of the images can be made very easily. Accordingly, in the case of using the photosensitive material of the invention, good workability can be obtained and further transference of images can be conducted easily and accurately. In spite that the photosensitive transfer material of the invention has the above-mentioned excellent characteristics, the adhesion strength in the transferring stage is hardly reduced as compared with a case of using a photosensitive material containing conventional matting agent particles. Therefore, the obtained final image shows high stability.

Further, the photosensitive transfer material of the invention is free from occurrence of air bubbles caused by introduction of air in the transferring stage, so that the commercial value is not reduced. Moreover, since the aforementioned specific matting agent particles have high dispersing stability, a photosensitive transfer material can be easily prepared.

We claim:

1. A photosensitive transfer material comprising a support, a subbing layer comprising an alcohol-soluble polyamide and an image-forming layer containing a photosensitive polymer, in which the subbing layer contains a matting agent of core-shell type crosslinked resin particles consisting of a core part made of a polymer having a crosslinking degree of 0.05 to 3.0 mmole/g and a shell part made of a substantially linear polymer having at least one kind of a hydrophilic functional group.

2. The photosensitive transfer material as claimed in claim 1, wherein the hydrophilic functional group contained in the shell part of the matting agent is selected from a carboxyl group, a hydroxyl group, an amide group, a sulfonic acid group, a group in the form of an amine salt of a sulfonic acid, and a group in the form of an alkali metal salt of a sulfonic acid.

3. The photosensitive transfer material as claimed in claim 1, wherein the particle diameter of the matting agent is in the range of 0.005 to 10 μm.

4. The photosensitive transfer material as claimed in claim 1, wherein a ratio between the core part of the matting agent particle and the shell part thereof is in the range of 99:1 to 10:90, by weight.

5. The photosensitive transfer material as claimed in claim 1, wherein the matting agent is contained in the range of 0.002 to 50% by weight, based on the amount of the polymer of the layer containing the matting agent.

6. The photosensitive transfer material as claimed in claim 1, wherein the matting agent is contained in the range of 1 to 20% by weight, based on the amount of the polymer of the layer containing the matting agent.

7. The photosensitive transfer material as claimed in claim 1, wherein the subbing layer is composed of a peel layer and a barrier layer.

8. The photosensitive transfer material as claimed in claim 7, wherein the barrier layer contains the matting agent.

9. The photosensitive transfer material as claimed in claim 1, wherein the matting agent is further contained in the image-forming layer.

* * * * *